(12) United States Patent
Cha et al.

(10) Patent No.: US 11,705,063 B2
(45) Date of Patent: Jul. 18, 2023

(54) DISPLAY DEVICE (71) Applicant: SAMSUNG DISPLAY CO., LTD., Yongin-si (KR)

(72) Inventors: Myounggeun Cha, Seoul (KR); Sanggun Choi, Suwon-si (KR); Hyena Kwak, Suwon-si (KR); Jiyeong Shin, Suwon-si (KR); Yongsu Lee, Seoul (KR); Kiseok Choi, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/897,646

(22) Filed: Jun. 10, 2020

(65) Prior Publication Data
US 2021/0043139 A1 Feb. 11, 2021

(30) Foreign Application Priority Data
Aug. 8, 2019 (KR) .................. 10-2019-0096473

(51) Int. Cl.
*G09G 3/3233* (2016.01)
*G09G 3/3266* (2016.01)
(Continued)

(52) U.S. Cl.
CPC ......... *G09G 3/3233* (2013.01); *G09G 3/3266* (2013.01); *G09G 3/3291* (2013.01);
(Continued)

(58) Field of Classification Search
CPC ............. H01L 27/3276; H01L 27/3262; H01L 27/3265; G09G 3/3233; G09G 3/3266; G09G 3/3291
See application file for complete search history.

(56) References Cited

U.S. PATENT DOCUMENTS

| 10,140,039 | B1 | 11/2018 | Baruch et al. |
| 2010/0302230 | A1* | 12/2010 | Moon .................. G09G 3/3677 345/212 |

(Continued)

FOREIGN PATENT DOCUMENTS

| KR | 10-2015-0075687 | 7/2015 |
| KR | 10-2016-0017719 | 2/2016 |

(Continued)

*Primary Examiner* — Nelson M Rosario
*Assistant Examiner* — Scott D Au
(74) *Attorney, Agent, or Firm* — F. Chau & Associates, LLC (57) ABSTRACT A display device includes a first transistor including a first channel region, a first gate electrode overlapping the first channel region, and a first electrode connected to a node receiving a driving voltage, a second transistor electrically connected to the first electrode of the first transistor, the second transistor including a second channel region and a second gate electrode overlapping the first channel region and receiving a scan signal, a light emitting element electrically connected to a second electrode of the first transistor, a first conductive line overlapping the first gate electrode with the first channel region in between and receiving a variable voltage different from the driving voltage, and a second conductive line overlapping the second gate electrode with the second channel region in between and receiving the scan signal.

22 Claims, 8 Drawing Sheets (51) Int. Cl.
   *G09G 3/3291* (2016.01)
   *H10K 59/131* (2023.01)
   *H10K 59/121* (2023.01)

(52) U.S. Cl.
   CPC ....... *H10K 59/1213* (2023.02); *H10K 59/131* (2023.02); *G09G 2320/0233* (2013.01); *G09G 2320/0257* (2013.01); *G09G 2330/028* (2013.01); *H10K 59/1216* (2023.02)

(56) References Cited

U.S. PATENT DOCUMENTS

| | | | |
|---|---|---|---|
| 2016/0190171 A1 | 6/2016 | Wang et al. | |
| 2018/0130418 A1* | 5/2018 | Zhu | H01L 27/3265 |
| 2018/0212014 A1* | 7/2018 | Choi | G09G 3/3233 |
| 2019/0341440 A1* | 11/2019 | Cha | H01L 27/3262 |
| 2020/0027939 A1* | 1/2020 | Cho | H01L 27/3262 |
| 2021/0201790 A1* | 7/2021 | Gai | G09G 3/3233 |

FOREIGN PATENT DOCUMENTS

| | | |
|---|---|---|
| KR | 10-2017-0064128 | 6/2017 |
| KR | 10-2018-0026602 | 3/2018 |

\* cited by examiner

DISPLAY DEVICE

CROSS-REFERENCE TO RELATED APPLICATION(S)

This U.S. non-provisional patent application claims priority under 35 USC § 119 to Korean Patent Application No. 10-2019-0096473 filed on Aug. 8, 2019 in the Korean Intellectual Property Office (KIPO), the disclosure of which is incorporated by reference in its entirety herein.

BACKGROUND

1. Technical Field

Embodiments of the inventive concept relate to a display device. More particularly, embodiments of the inventive concept relate to a display device including a plurality of transistors.

2. Discussion of Related Art

A display device may include a plurality of pixels to display an image. Each of the pixels may include a plurality of transistors including a driving transistor and a light emitting element electrically connected to the transistors. The driving transistor included in each of the pixels may generate a driving current, and the light emitting element included in each of the pixels may emit light with a luminance corresponding to an amount of the driving current. However, a voltage-current characteristic of the driving transistor during a current period may change according to an operating state of the driving transistor during a previous period. In other words, the driving transistors included in the pixels may have hysteresis.

When the display device has displayed a black image during a previous period, and then displays a white image during a next period, a luminance of the display device during the next period may be lower than desired due to the hysteresis of the driving transistors. This phenomenon may be referred to as step efficiency. Further, when display regions in the display device are driven with different gray levels during previous periods, the display regions may emit different luminances for a certain time even if the display regions are driven with the same gray level during subsequent periods, due to the hysteresis of the driving transistors. This phenomenon may be referred to as instantaneous afterimage.

SUMMARY

At least one embodiment of the inventive concept provides a display device with improved step efficiency and/or reduced instantaneous afterimages.

A display device according to an exemplary embodiment of the inventive concept includes a first transistor including a first channel region, a first gate electrode overlapping the first channel region, and a first electrode receiving a driving voltage, a second transistor electrically connected to the first electrode of the first transistor, the second transistor including a second channel region and a second gate electrode overlapping the second channel region and receiving a scan signal, a light emitting element electrically connected to a second electrode of the first transistor, a first conductive line overlapping the first gate electrode receiving a variable voltage different from the driving voltage, and a second conductive line overlapping the second gate electrode receiving the scan signal. The first channel region is located between the first conductive line and the first gate electrode. The second channel region is located between the second conductive line and the second gate electrode.

In an embodiment, the variable voltage is a positive voltage greater than the driving voltage or a negative voltage lower than the driving voltage.

In an embodiment, the display device furthers include a third transistor electrically connected to the second electrode of the first transistor, the third transistor including a third channel region and a third gate electrode overlapping the third channel region and receiving the scan signal.

In an embodiment, the second conductive line overlaps the third gate electrode and the third channel region is located between the second conductive line and the third gate electrode.

In an embodiment, the display device further includes a scan line receiving the scan signal, where each of the second gate electrode and the third gate electrode is a portion of the scan line.

In an embodiment, the first conductive line includes an extending portion extending along a first direction and an overlapping portion overlapping the first gate electrode.

In an embodiment, a width of the overlapping portion in a second direction crossing the first direction is greater than a width of the extending portion in the second direction.

In an embodiment, the second conductive line includes an extending portion extending along a first direction and an overlapping portion overlapping the second gate electrode.

In an embodiment, the overlapping portion protrudes from the extending portion in a second direction crossing the first direction.

In an embodiment, the first conductive line is connected to a variable voltage supplying line located outside a display area.

In an embodiment, the second conductive line is connected to a scan signal supplying line located outside a display area.

In an embodiment, each of the first transistor and the second transistor is a p-channel metal-oxide semiconductor (PMOS) transistor.

A display device according to an exemplary embodiment of the inventive concept includes a substrate, a first conductive layer disposed on the substrate and receiving a variable voltage, a second conductive layer disposed on the substrate, spaced apart from the first conductive layer, and receiving a scan signal, a first transistor including a first active layer disposed on the first conductive layer and a first gate electrode disposed on the first active layer, a second transistor including a second active layer disposed on the second conductive layer and electrically connected to a first end of the first active layer and a second gate electrode disposed on the second active layer and receiving the scan signal, and a light emitting element electrically connected to the first transistor. The first end of the first active layer receives a driving voltage different from the variable voltage.

In an embodiment, the variable voltage is a positive voltage greater than the driving voltage or a negative voltage less than the driving voltage.

In an embodiment, the display device further includes a third transistor including a third active layer disposed on the second conductive layer and electrically connected to a second end of the first active layer and a third gate electrode disposed on the third active layer and receiving the scan signal.

In an embodiment, the first conductive layer is connected to a variable voltage supplying line located outside a display area.

In an embodiment, the variable voltage supplying line is disposed on the first conductive layer, an insulation layer is located between the variable voltage supplying line and the first conductive layer outside the display area, and the first conductive layer contacts the variable voltage supplying line through a contact hole formed in the insulation layer.

In an embodiment, the second conductive layer is connected to a scan signal supplying line located outside a display area.

In an embodiment, the scan signal supplying line is disposed on the second conductive layer, an insulation layer is located between the scan signal supplying line and the second conductive layer outside the display area, and the second conductive layer contacts the scan signal supplying line through a contact hole formed in the insulation layer.

In an embodiment, each of the first transistor and the second transistor is a p-channel metal-oxide semiconductor (PMOS) transistor.

According to an exemplary embodiment of the inventive concept, a display device includes a light emitting element, a driving transistor, and a driving circuit. The driving transistor is for controlling a current passing through the light emitting element. The driving transistor includes a first terminal connected to a node receiving a driving voltage and a bottom gate terminal connected to a node receiving a variable voltage. The driving circuit is configured to provide the variable voltage, wherein the variable voltage is a positive voltage greater than driving voltage or a negative voltage less than the driving voltage.

In an exemplary embodiment, the driving circuit is configured to change a value of the variable voltage to the negative voltage to increase a step efficiency of the display device or to the positive voltage to reduce a number of afterimages perceivable on the display device.

A display device according to at least embodiment of the inventive concept may include the first conductive line overlapping the first gate electrode with the first channel region of the first transistor in between and receiving the variable voltage and the second conductive line overlapping the second gate electrode with the second channel region of the second transistor in between and receiving the scan signal, so that step efficiency and/or instantaneous afterimages of the display device may be improved.

BRIEF DESCRIPTION OF THE DRAWINGS

The inventive concept will become more apparent by describing in detail exemplary embodiments thereof with reference to the accompanying drawings, in which.

DETAILED DESCRIPTION OF THE EXEMPLARY EMBODIMENTS

Hereinafter, display devices in accordance with exemplary embodiments of the inventive concept will be explained in detail with reference to the accompanying drawings.

Figure 1:
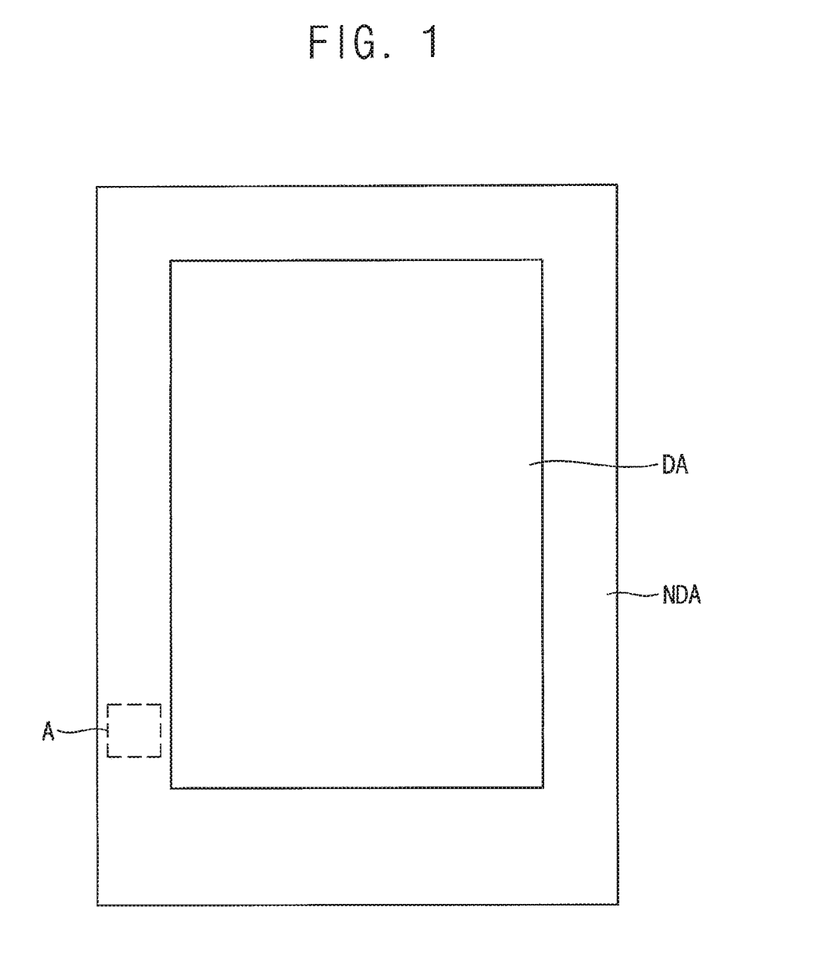
FIG. 1 is a plan view illustrating a display device according to an exemplary embodiment of the inventive concept.

FIG. 1 is a plan view illustrating a display device according to an exemplary embodiment of the inventive concept.

Referring to FIG. 1, a display device includes a display area DA and a non-display area NDA. The display area DA may display an image. The display area DA may have a substantially quadrangular shape, however, the shape of the display area DA is not limited thereto. The non-display area NDA may be disposed on a periphery of the display area DA. For example, the non-display area NDA may surround the display area DA. The non-display area NDA does not display an image.

Figure 2:
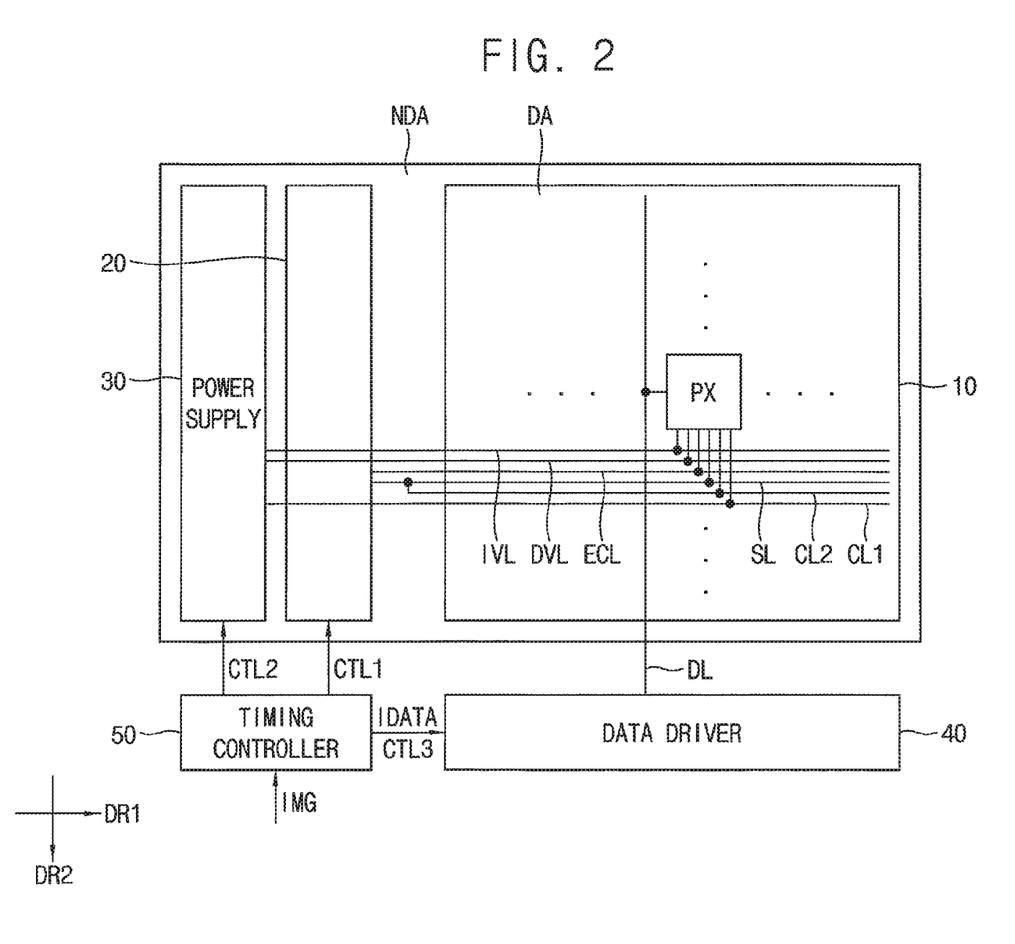
FIG. 2 is a block diagram illustrating the display device in FIG. 1 according to an exemplary embodiment of the inventive concept.

FIG. 2 is a block diagram illustrating the display device in FIG. 1 according to an exemplary embodiment of the inventive concept.

Referring to FIG. 2, the display device includes a display unit 10 (e.g., a display panel), a driving circuit unit 20 (e.g., a driving circuit or a voltage generator), a power supply 30, a data driver 40 (e.g., a source driver), and a timing controller 50 (e.g., a timing control circuit).

The display unit 10 may be disposed in the display area DA. The display unit 10 may include a plurality of pixels PX. The pixels PX may be arranged substantially in a matrix form along a first direction DR1 and a second direction DR2 crossing the first direction DR1. Each of the pixels PX may be connected to a scan line SL, an emission control line ECL, an initialization voltage line IVL, a driving voltage line DVL, a data line DL, a first conductive line CL1, and a second conductive line CL2. Each of the pixels PX may emit light in response to signals applied through the scan line SL, the emission control line ECL, the initialization voltage line IVL, the driving voltage line DVL, the data line DL, the first conductive line CL1, and the second conductive line CL2.

The driving circuit unit 20 and the power supply 30 may be disposed in the non-display area NDA. The driving circuit unit 20 may include a scan driver generating a scan signal and an emission control driver generating an emission control signal. The driving circuit unit 20 may transmit the scan signal to the pixel PX through the scan line SL, and may transmit the emission control signal to the pixel PX through the emission control line ECL. In an embodiment, the driving circuit unit 20 may be disposed on one side of the display unit 10, however, the present disclosure is not limited thereto. In another embodiment, the scan driver of the driving circuit unit 20 may be disposed on one side of the display unit 10, and the emission control driver of the driving circuit unit 20 may be disposed on another side of the display unit 10.

The power supply 30 may generate an initialization voltage, a driving voltage, and a variable voltage. The power supply 30 may transmit the initialization voltage to the pixel PX through the initialization voltage line IVL, may transmit the driving voltage to the pixel PX through the driving voltage line DVL, and may transmit the variable voltage to the pixel PX through the first conductive line CL1. In an embodiment, the power supply 30 may be disposed on one side of the display unit 10 at which the driving circuit unit 20 is disposed, however, the present disclosure is not limited thereto. In another embodiment, the power supply 30 may be disposed on another side of the display unit 10 at which the driving circuit unit 20 is not disposed, or may be disposed on opposite sides of the display unit 10.

The data driver 40 may generate a data voltage. The data driver 40 may transmit the data voltage to the pixel PX through the data line DL. In an embodiment, the data driver 40 is disposed on a printed circuit board (PCB) connected to the non-display area NDA. However, the present disclosure is not limited thereto. For example, in another embodiment, the data driver 40 may be disposed in the non-display area NDA.

The timing controller 50 may convert image data IMG supplied from an external device into input image data IDATA, and generate a first control signal CTL1, a second control signal CTL2, and a third control signal CTL3 which control a driving of the input image data IDATA. The timing controller 50 may convert the image data IMG supplied from the external device into the input image data IDATA by applying an algorithm (such as dynamic capacitance compensation (DCC)) configured to correct image quality to the image data IMG. The timing controller 50 may provide the first control signal CTL1 to the driving circuit unit 20, may provide the second control signal CTL2 to the power supply 30, and may provide the input image data IDATA and the third control signal CTL3 to the data driver 40.

Figure 3:
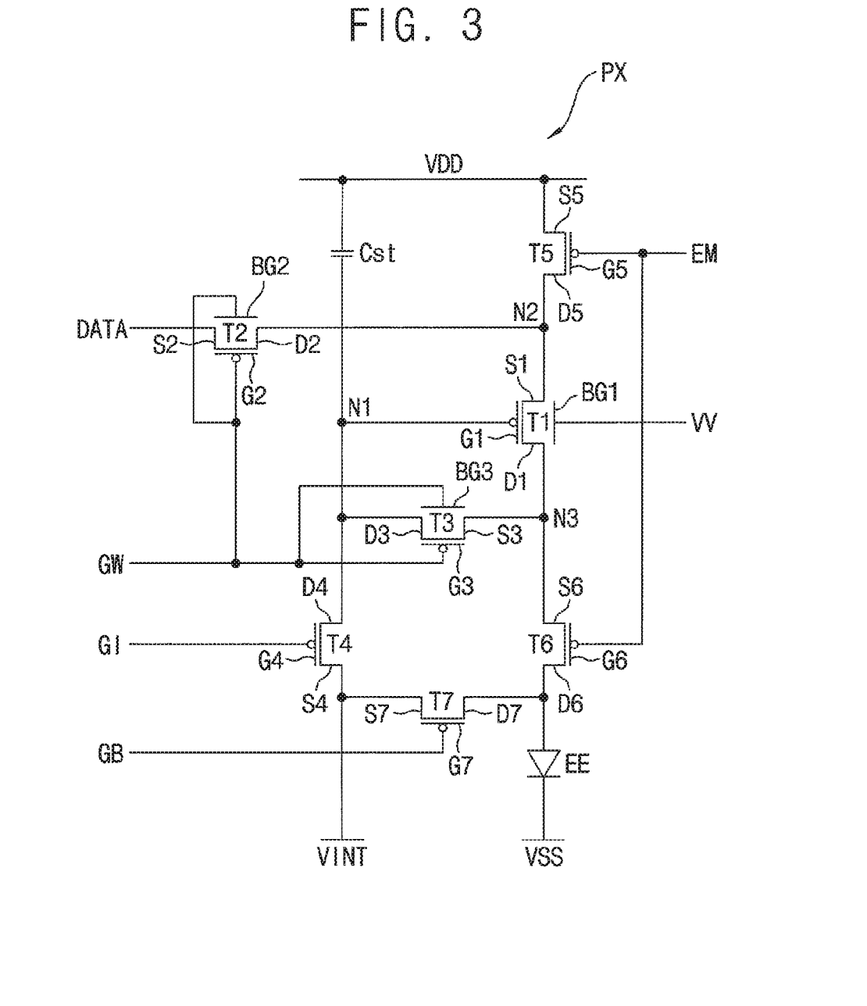
FIG. 3 is a circuit diagram illustrating a pixel of the display device in FIG. 2.

FIG. 3 is a circuit diagram illustrating the pixel PX of the display device in FIG. 2. FIG. 3 may illustrate one pixel PX of pixels included in each of the plurality of pixel rows.

Referring to FIG. 3, the pixel PX includes a first transistor T1, a second transistor T2, a third transistor T3, a fourth transistor T4, a fifth transistor T5, a sixth transistor T6, a seventh transistor T7, a storage capacitor Cst, and a light emitting element EE. However, the present embodiment is not limited thereto, and the number of the transistors and/or the number of the capacitors included in the pixel PX may be variously changed. In an embodiment, the pixel PX may include an organic light emitting diode as the light emitting element EE.

The first transistor T1 includes a first gate electrode G1, a first source electrode S1, a first drain electrode D1, and a first bottom gate electrode BG1. In an exemplary embodiment, the first transistor T1 is a dual gate transistor including the first gate electrode G1 and the first bottom gate electrode BG1 which function as gate electrodes. The first gate electrode G1 is connected to a first node N1. The first source electrode S1 is connected to a second node N2, and the first drain electrode D1 is connected to a third node N3. The first bottom gate electrode BG1 receives a variable voltage VV. The first transistor T1 may be a driving transistor for controlling a current passing through the light emitting element EE. In an exemplary embodiment, the power supply 30 provides the variable voltage VV. In an exemplary embodiment, the power supply 30 is configured to change the variable voltage VV to one of various types of positive voltages or one of various types of negative voltages by considering a desired step efficiency and/or a desired target number of afterimages. In an exemplary embodiment, the timing controller 50 analyzes the image data IMG to determine a result indicating whether step efficiency needs to be improved and/or a result indicating whether afterimages need to be improved, the timing controller 50 determines a variable voltage VV from the results, and sends a control signal to the power supply 30 informing power supply 30 of the determined variable voltage VV to apply to the first bottom gate electrode BG1.

The second transistor T2 includes a second gate electrode G2, a second source electrode S2, a second drain electrode D2, and a second bottom gate electrode BG2. In an exemplary embodiment, the second transistor T2 is a dual gate transistor including the second gate electrode G2 and the second bottom gate electrode BG2 which function as gate electrodes. The second gate electrode G2 receives a first scan signal GW. The first scan signal GW may be a scan signal (or a gate signal) for a pixel row including the pixel PX. The second source electrode S2 receives a data voltage DATA, and the second drain electrode D2 is connected to the second node N2. The second bottom gate electrode BG2 receives the first scan signal GW. The second transistor T2 may be a switching transistor for turning on or turning off the first transistor T1.

The third transistor T3 includes a third gate electrode G3, a third source electrode S3, a third drain electrode D3, and a third bottom gate electrode BG3. In an exemplary embodiment, the third transistor T3 is a dual gate transistor including the third gate electrode G3 and the third bottom gate electrode BG3 which function as gate electrodes. The third gate electrode G3 receives the first scan signal GW. The third source electrode S3 is connected to the third node N3, and the third drain electrode D3 is connected to the first node N1. The third bottom gate electrode BG3 receives the first scan signal GW. The third transistor T3 may be a compensation transistor for connecting between the first drain electrode D1 and the first gate electrode G1 of the first transistor T1 that is the driving transistor.

The fourth transistor T4 includes a fourth gate electrode G4, a fourth source electrode S4, and a fourth drain electrode D4. The fourth gate electrode G4 receives a second scan signal GI. In an embodiment, the second scan signal GI is a scan signal for a previous pixel row of the pixel row including the pixel PX. In an exemplary embodiment, the second scan signal GI is the first scan signal GW applied to a pixel in the previous pixel row. The fourth source electrode S4 receives an initialization voltage VINT, and the fourth drain electrode D4 is connected to the first node N1. The fourth transistor T4 may be an initialization transistor for initializing the first gate electrode G1 of the first transistor T1 that is the driving transistor.

The fifth transistor T5 includes a fifth gate electrode G5, a fifth source electrode S5, and a fifth drain electrode D5. The fifth gate electrode G5 receives an emission control signal EM. The fifth source electrode S5 may receive a driving voltage VDD, and the fifth drain electrode D5 is connected to the second node N2. In an exemplary embodiment, the driving voltage VDD is a constant voltage.

The sixth transistor T6 includes a sixth gate electrode G6, a sixth source electrode S6, and a sixth drain electrode D6. The sixth gate electrode G6 receives the emission control signal EM. The sixth source electrode S6 is connected to the third node N3, and the sixth drain electrode D6 is connected to an anode of the light emitting element EE.

Each of the fifth transistor T5 and the sixth transistor T6 may be an emission control transistor for transmitting the driving voltage VDD to the light emitting element EE through the first transistor T1 that is the driving transistor.

The seventh transistor T7 includes a seventh gate electrode G7, a seventh source electrode S7, and a seventh drain electrode D7. The seventh gate electrode G7 receives a third scan signal GB. In an embodiment, the third scan signal GB is a scan signal for a following pixel row of the pixel row including the pixel PX. In an exemplary embodiment, the third scan signal GB is the first scan signal GW applied to a pixel in the following pixel row. The seventh source electrode S7 receives the initialization voltage VINT, and the seventh drain electrode D7 is connected to the anode of the light emitting element EE. The seventh transistor T7 may be an initialization transistor for initializing the anode of the light emitting element EE.

The first to seventh transistors T1, T2, T3, T4, T5, T6, and T7 may be the same type of transistor. In an embodiment, each of the first to seventh transistors T1, T2, T3, T4, T5, T6, and T7 is p-channel metal-oxide semiconductor (PMOS) transistor. However, the present disclosure is not limited thereto. For example, in another embodiment, each of the first to seventh transistors T1, T2, T3, T4, T5, T6, and T7 is an n-channel metal-oxide semiconductor (NMOS) transistor.

The storage capacitor Cst includes a first electrode connected to the first node N1 and a second electrode receiving the driving voltage VDD.

The light emitting element EE may include the anode and a cathode. The anode of the light emitting element EE is connected to the sixth drain electrode D6 of the sixth transistor T6 and the seventh drain electrode D7 of the seventh transistor T7, and the cathode of the light emitting element EE receives a common voltage VSS. In an exemplary embodiment, the common voltage VSS is lower than the driving voltage VDD.

Figure 4:
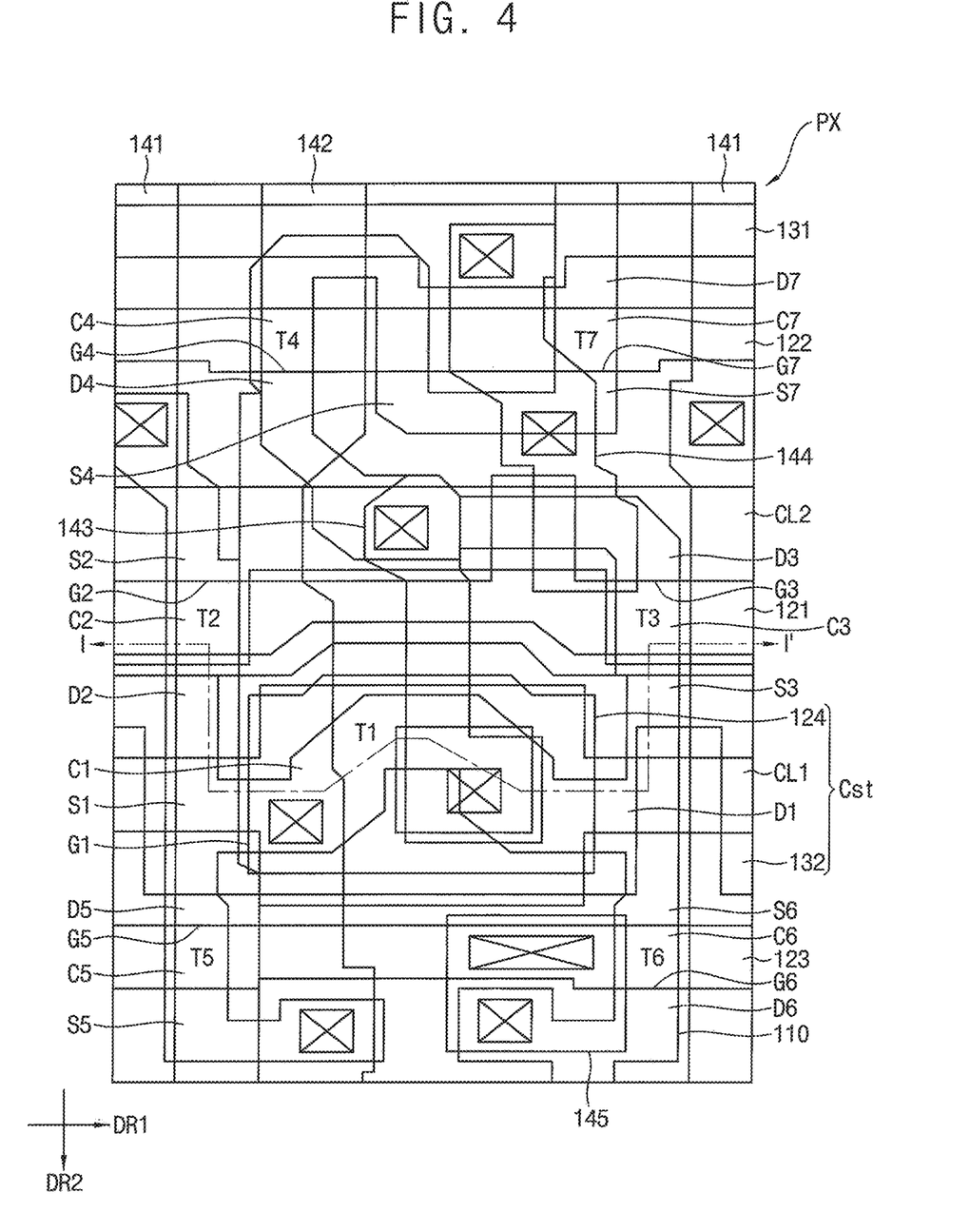
FIG. 4 is a plan view illustrating a display area of the display device in FIG. 1.
Figure 5:
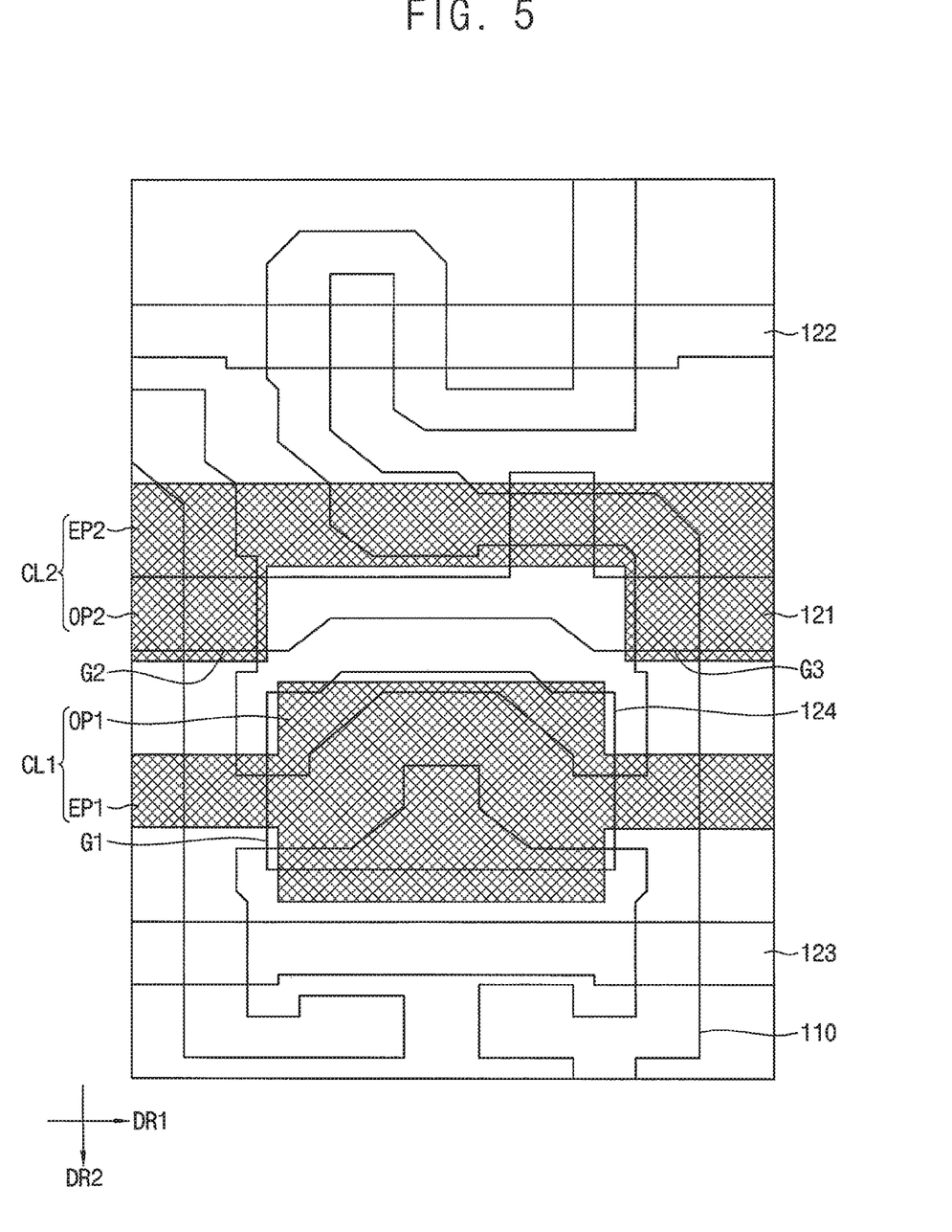
FIG. 5 is a plan view illustrating a first conductive line and a second conductive line in FIG. 4.
Figure 6:
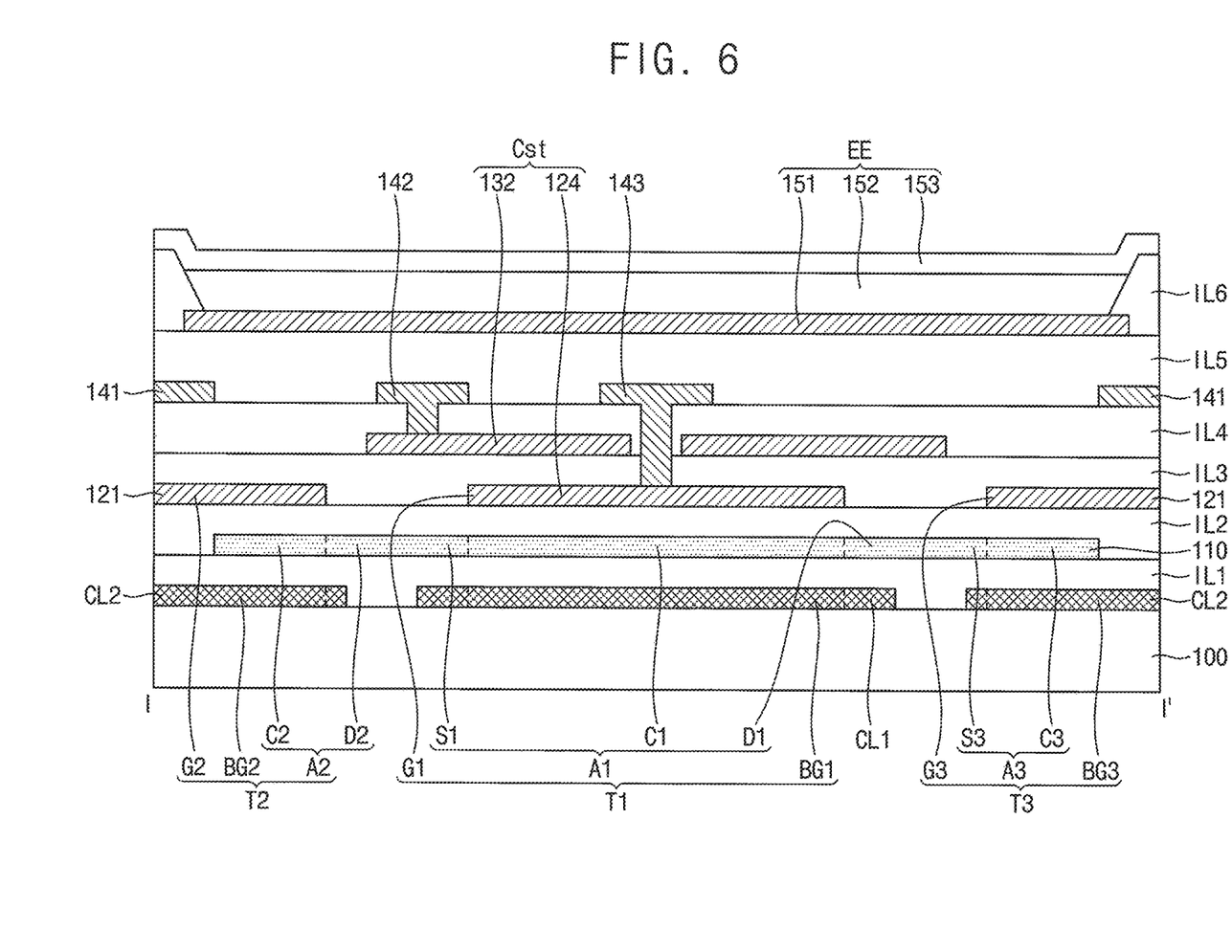
FIG. 6 is a cross-sectional view taken along a line I-I' in FIG. 4.

FIG. 4 is a plan view illustrating the display area DA of the display device in FIG. 1 according to an exemplary embodiment of the inventive concept. For example, FIG. 4 may illustrate the pixel PX in FIG. 2. FIG. 5 is a plan view illustrating the first conductive line CL1 and the second conductive line CL2 in FIG. 4. FIG. 6 is a cross-sectional view taken along a line I-I' in FIG. 4.

Referring to FIGS. 4, 5, and 6, the display device includes a substrate 100, the first conductive line CL1, the second conductive line CL2, an active pattern 110, a first scan line 121, a second scan line 122, am emission control line 123, an initialization voltage line 131, the first to seventh transistors T1, T2, T3, T4, T5, T6, and T7, the storage capacitor Cst, a data line 141, a driving voltage line 142, a first connecting pattern 143, a second connecting pattern 144, a third connecting pattern 145, and the light emitting element EE which are disposed in the display area DA. The scan line SL illustrated in FIG. 2 may include the first scan line 121 and the second scan line 122.

The substrate 100 may be an insulating substrate including glass, a polymer, or stainless steel. In an embodiment, the substrate 100 may include a first plastic layer, a first barrier layer, a second plastic layer, and a second barrier layer, which are sequentially stacked. For example, each of the first plastic layer and the second plastic layer may include plastic such as polyimide (PI), polyethylene naphthalate (PEN), polyethylene terephthalate (PET), polyarylate (PAR), polycarbonate (PC), polyetherimide (PEI), or polyethersulfone (PS). Each of the first barrier layer and the second barrier layer may include silicon compounds such as amorphous silicon (a-Si), silicon oxide ($SiO_x$), or silicon nitride ($SiN_x$).

The first conductive line CL1 and the second conductive line CL2 are disposed on the substrate 100. The first conductive line CL1 and the second conductive line CL2 may be spaced apart from each other. The first conductive line CL1 and the second conductive line CL2 may include a metal such as molybdenum (Mo).

The first conductive line CL1 receives a variable voltage. The variable voltage may selectively have a positive voltage or a negative voltage. For example, the first conductive line CL1 may receive the positive voltage when a first improvement (e.g., reduced instantaneous afterimages) is desired and receive a negative voltage when a second other improvement (e.g., increased step efficiency) is desired. In an exemplary embodiment, the positive voltage is higher than the driving voltage VDD. The first conductive line CL1 includes a first extending portion EP1 extending along the first direction DR1 and a first overlapping portion OP1 overlapping the first gate electrode G1 of the first transistor T1. In an exemplary embodiment of the inventive concept, a width of the first overlapping portion OP1 in the second direction DR2 is greater than a width of the first extending portion EP1 in the second direction DR2.

The second conductive line CL2 receives a scan signal (e.g., a gate signal). The second conductive line CL2 includes a second extending portion EP2 extending along the first direction DR1 and a second overlapping portion OP2 overlapping the second gate electrode G2 of the second transistor T2 and the third gate electrode G3 of the third transistor T3. For example, the second overlapping portion OP2 may include a first portion overlapping the second gate electrode G2 and a second portion overlapping the third gate electrode G3. The second overlapping portion OP2 may protrude in the second direction DR2 from the second extending portion EP2. Hereinafter, in the present disclosure, the first conductive line CL1 is described as having the same meaning as a first conductive layer CL1, and the second conductive line CL2 is described as having the same meaning as a second conductive layer CL2.

In an embodiment, a first insulation layer IL1 is disposed on the first conductive layer CL1 and the second conductive layer CL2. The first insulation layer IL1 may include an inorganic insulation material such as silicon nitride ($SiN_x$), or silicon oxide ($SiO_x$).

The active pattern 110 is disposed on the first insulation layer ILL The active pattern 110 may be formed of polysilicon or an oxide semiconductor. The oxide semiconductor may include an oxide based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof such as zinc oxide (ZnO), indium-gallium-zinc oxide (In—Ga—Zn—O), indium-zinc oxide (Zn—In—O), zinc-tin oxide (Zn—Sn—O) indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

A second insulation layer IL2 is disposed on the active pattern 110. The second insulation layer IL2 may include an inorganic insulation material such as silicon nitride ($SiN_x$) or silicon oxide ($SiO_x$).

In an exemplary embodiment, the first scan line 121, the second scan line 122, and the emission control line 123 are disposed on the second insulation layer IL2. The first scan line 121, the second scan line 122, and the emission control line 123 may include a metal such as molybdenum (Mo). The first scan line 121 may extend along the first direction DR1, and receives the scan signal. The second scan line 122 may extend along the first direction DR1. In an exemplary embodiment, the second scan line 122 is spaced apart from the first scan line 121, and receives a previous scan signal that is a scan signal of a previous pixel row. The emission control line 123 may extend along the first direction DR1. In an exemplary embodiment, the emission control line 123 is spaced apart from the second scan line 122, and receives an emission control signal.

In an exemplary embodiment, a third insulation layer IL3 is disposed on the first scan line 121, the second scan line 122, and the emission control line 123. The third insulation layer IL3 may include an inorganic insulation material such as silicon nitride ($SiN_x$) or silicon oxide ($SiO_x$).

In an exemplary embodiment, the initialization voltage line 131 is disposed on the third insulation layer IL3. The initialization voltage line 131 may include a metal such as molybdenum (Mo). The initialization voltage line 131 may extend along the first direction DR1.

The first transistor T1 includes a first active layer A1, the first gate electrode G1, and the first bottom gate electrode BG1. In an exemplary embodiment, the first bottom gate electrode BG1 is wider than the first gate electrode G1. For example, a left side of the first bottom gate electrode BG1 may extend past a left side of the first gate electrode G1 and a right side of the first bottom gate electrode BG1 may extend past a right side of the first gate electrode G1. The first active layer A1 includes the first source electrode S1, the first drain electrode D1, and a first channel region C1 formed between the first source electrode S1 and the first drain electrode D1. The first active layer A1 is a portion of the active pattern 110.

The first source electrode S1 is connected to the second drain electrode D2 of the second transistor T2 and the fifth drain electrode D5 of the fifth transistor T5, and the first drain electrode D1 is connected to the third source electrode S3 of the third transistor T3 and the sixth source electrode S6 of the sixth transistor T6. The first channel region C1 may be channel-doped with an N-type impurity or a P-type impurity, and each of the first source electrode S1 and the first drain electrode D1 may be doped with an opposite type of impurity to that with which the first channel region C1 is doped.

The first gate electrode G1 may be disposed on the first active layer A1. For example, the first gate electrode G1 may overlap the first active layer A1. In an embodiment, the first gate electrode G1 has an island shape. The first gate electrode G1 may be disposed on the same layer as those of the first scan line 121, the second scan line 122, and the emission control line 123, and may include the same material as those of the first scan line 121, the second scan line 122, and the emission control line 123. For example, the first gate electrode G1 may be disposed on the second insulation layer IL2, and may include a metal such as molybdenum (Mo). In an exemplary embodiment, the first gate electrode G1 overlaps the first channel region C1. In an exemplary embodiment, the first gate electrode G1 and the first channel region C1 are aligned with one another in a plan view. In an exemplary embodiment, the first channel region C1 overlaps the first gate electrode G1 but does not extend past left and right edges of the first gate electrode G1.

The first bottom gate electrode BG1 may be disposed between the substrate 100 and the first active layer A1. In an exemplary embodiment, the first bottom gate electrode BG1 is a portion of the first conductive line CL1. Specifically, the first bottom gate electrode BG1 may be a portion of the first conductive line CL1 which overlaps the first channel region C1. The first bottom gate electrode BG1 may overlap the first gate electrode G1 with the first channel region C1 in between.

As described above, a portion of the first conductive line CL1 which receives the variable voltage selectively having a positive voltage or a negative voltage may form the first bottom gate electrode BG1, so that step efficiency of the display device may be improved and/or instantaneous afterimages perceived on the display device may be reduced or prevented. In an exemplary embodiment of the inventive concept, when the first bottom gate electrode BG1 receives the variable voltage having a negative voltage, an on-current of the first transistor T1 increases, thereby improving the step efficiency of the display device. In an exemplary embodiment of the inventive concept, when the first bottom gate electrode BG1 receives the variable voltage having a positive voltage, hysteresis of the first transistor T1 is improved, thereby reducing or preventing perception of instantaneous afterimages on the display device due to the hysteresis of the first transistor.

The second transistor T2 includes a second active layer A2, the second gate electrode G2, and the second bottom gate electrode BG2. The second active layer A2 may include the second source electrode S2, the second drain electrode D2, and a second channel region C2 formed between the second source electrode S2 and the second drain electrode D2. The second active layer A2 is a portion of the active pattern 110.

The second drain electrode D2 is connected to the first source electrode S1 of the first transistor T1 and the fifth drain electrode D5 of the fifth transistor T5. The second channel region C2 may be channel-doped with an N-type impurity or a P-type impurity, and each of the second source electrode S2 and the second drain electrode D2 may be doped with an opposite type of impurity to that with which the second channel region C2 is doped.

The second gate electrode G2 may be disposed on the second active layer A2. For example, the second gate electrode G2 may overlap the second active layer A2. In an exemplary embodiment, the second gate electrode G2 is a portion of the first scan line 121. The second gate electrode G2 may overlap the second channel region C2.

The second bottom gate electrode BG2 may be disposed between the substrate 100 and the second active layer A2. In an exemplary embodiment, the second bottom gate electrode BG2 is a portion of the second conductive line CL2. Specifically, the second bottom gate electrode BG2 may be a portion of the second conductive line CL2 which overlaps the second channel region C2. The second bottom gate electrode BG2 may overlap the second gate electrode G2 with the second channel region C2 in between.

The third transistor T3 includes a third active layer A3, the third gate electrode G3, and the third bottom gate electrode BG3. The third active layer A3 may include the third source electrode S3, the third drain electrode D3, and a third channel region C3 formed between the third source electrode S3 and the third drain electrode D3. In an exemplary embodiment, the third active layer A3 is a portion of the active pattern 110.

The third source electrode S3 is connected to the first drain electrode D1 of the first transistor T1 and the sixth source electrode S6 of the sixth transistor T6, and the third drain electrode D3 is connected to the fourth drain electrode D4 of the fourth transistor T4. The third channel region C3 may be channel-doped with an N-type impurity or a P-type impurity, and each of the third source electrode S3 and the third drain electrode D3 may be doped with an opposite type of impurity to that with which the third channel region C3 is doped.

The third gate electrode G3 may be disposed on the third active layer A3. For example, the third gate electrode G3 may overlap the third active layer A3. In an exemplary embodiment, the third gate electrode G3 is a portion of the first scan line 121. The third gate electrode G3 may overlap the third channel region C3.

The third bottom gate electrode BG3 may be disposed between the substrate 100 and the third active layer A3. In an exemplary embodiment, the third bottom gate electrode BG3 is a portion of the second conductive line CL2. Specifically, the third bottom gate electrode BG3 may be a portion of the second conductive line CL2 which overlaps the third channel region C3. The third bottom gate electrode B G3 may overlap the third gate electrode G3 with the third channel region C3 in between.

As described above, portions of the second conductive line CL2 which receive the scan signal may respectively form the second bottom gate electrode BG2 and the third bottom gate electrode BG3, so that step efficiency of the display device may be improved. In an embodiment, when the second gate electrode G2 and the second bottom gate electrode BG2 of the second transistor T2 and the third gate electrode G3 and the third bottom gate electrode BG3 of the third transistor T3 receive the scan signal having a negative voltage, an on-current of the second transistor T2 and on-current of the third transistor T3 increases, thereby improving the step efficiency of the display device.

The fourth transistor T4 may include a fourth active layer and the fourth gate electrode G4. The fourth active layer may include the fourth source electrode S4, the fourth drain electrode D4, and a fourth channel region C4 formed between the fourth source electrode S4 and the fourth drain electrode D4. In an exemplary embodiment, the fourth active layer is a portion of the active pattern 110.

The fourth source electrode S4 is connected to the seventh source electrode S7 of the seventh transistor T7, and the fourth drain electrode D4 is connected to the third drain electrode D3 of the third transistor T3. The fourth channel region C4 may be channel-doped with an N-type impurity or a P-type impurity, and each of the fourth source electrode S4 and the fourth drain electrode D4 may be doped with an opposite type of impurity to that with which the fourth channel region C4 is doped.

The fourth gate electrode G4 may be disposed on the fourth active layer. In an exemplary embodiment, the fourth gate electrode G4 is a portion of the second scan line 122. The fourth gate electrode G4 may overlap the fourth channel region C4.

The fifth transistor T5 may include a fifth active layer and the fifth gate electrode G5. The fifth active layer may include the fifth source electrode S5, the fifth drain electrode D5, and a fifth channel region C5 formed between the fifth source electrode S5 and the fifth drain electrode D5. In an exemplary embodiment, the fifth active layer is a portion of the active pattern 110.

The fifth drain electrode D5 is connected to the first source electrode S1 of the first transistor T1 and the second drain electrode D2 of the second transistor T2. The fifth channel region C5 may be channel-doped with an N-type impurity or a P-type impurity, and each of the fifth source electrode S5 and the fifth drain electrode D5 may be doped with an opposite type of impurity to that with which the fifth channel region C5 is doped.

The fifth gate electrode G5 may be disposed on the fifth active layer. In an exemplary embodiment, the fifth gate electrode G5 is a portion of the emission control line 123. The fifth gate electrode G5 may overlap the fifth channel region C5.

The sixth transistor T6 may include a sixth active layer and the sixth gate electrode G6. The sixth active layer may include the sixth source electrode S6, the sixth drain electrode D6, and a sixth channel region C6 formed between the sixth source electrode S6 and the sixth drain electrode D6. In an exemplary embodiment, the sixth active layer is a portion of the active pattern 110.

The sixth source electrode S6 is connected to the first drain electrode D1 of the first transistor T1 and the third source electrode S3 of the third transistor T3. The sixth channel region C6 may be channel-doped with an N-type impurity or a P-type impurity, and each of the sixth source electrode S6 and the sixth drain electrode D6 may be doped with an opposite type of impurity to that with which the sixth channel region C6 is doped.

The sixth gate electrode G6 may be disposed on the sixth active layer. In an exemplary embodiment, the sixth gate electrode G6 is a portion of the emission control line 123. The sixth gate electrode G6 may overlap the sixth channel region C6.

The seventh transistor T7 may include a seventh active layer and the seventh gate electrode G7. The seventh active layer may include the seventh source electrode S7, the seventh drain electrode D7, and a seventh channel region C7 formed between the seventh source electrode S7 and the seventh drain electrode D7. In an exemplary embodiment, the seventh active layer is a portion of the active pattern 110.

The seventh source electrode S7 is connected to the fourth source electrode S4 of the fourth transistor T4. The seventh channel region C7 may be channel-doped with an N-type impurity or a P-type impurity, and each of the seventh source electrode S7 and the seventh drain electrode D7 may be doped with an opposite type of impurity to that with which the seventh channel region C7 is doped.

The seventh gate electrode G7 may be disposed on the seventh active layer. In an exemplary embodiment, the seventh gate electrode G7 is a portion of the second scan line 122. The seventh gate electrode G7 may overlap the seventh channel region C7.

The storage capacitor Cst includes a first capacitor electrode 124 and a second capacitor electrode 132. The first capacitor electrode 124 may be the first gate electrode G1. In other words, the first capacitor electrode 124 may function as an electrode of the storage capacitor Cst as well as a top gate electrode of the first transistor T1.

The second capacitor electrode 132 may be disposed on the first capacitor electrode 124. In an exemplary embodiment, the second capacitor electrode 132 has an island shape. In an exemplary embodiment, the second capacitor electrode 132 is disposed on the same layer as that of the initialization voltage line 131, and may include the same material as that of the initialization voltage line 131. For example, the second capacitor electrode 132 may be disposed on the third insulation layer IL3, and may include a metal such as molybdenum (Mo). The second capacitor electrode 132 overlaps the first capacitor electrode 124. For example, the second capacitor electrode 132 may overlap the first capacitor electrode 124 in a plan view.

A fourth insulation layer IL4 may be disposed on the initialization voltage line 131 and the second capacitor electrode 132. The fourth insulation layer IL4 may include an inorganic insulation material such as silicon nitride ($SiN_x$), or silicon oxide ($SiO_x$) and/or an organic insulation material such as polyimide (PI).

The data line 141, the driving voltage line 142, the first connecting pattern 143, the second connecting pattern 144, and the third connecting pattern 145 may be disposed on the fourth insulation layer IL4. The data line 141, the driving voltage line 142, the first connecting pattern 143, the second connecting pattern 144, and the third connecting pattern 145 may include a metal such as aluminum (Al), or titanium (Ti).

The data line 141 may extend along the second direction DR2. The data line 141 may be connected to the second source electrode S2 of the second transistor T2 through a contact hole.

The driving voltage line 142 may extend along the second direction DR2. In an exemplary embodiment, the driving voltage line 142 is spaced apart from the data line 141. The driving voltage line 142 may be connected to the fifth source electrode S5 of the fifth transistor T5 through a contact hole, and may be connected to the second capacitor electrode 132 of the storage capacitor Cst through another contact hole.

In an exemplary embodiment, the first connecting pattern 143 is spaced apart from the driving voltage line 142. The first connecting pattern 143 may be connected to the first gate electrode G1 of the first transistor T1 through a contact hole, and may be connected to the third drain electrode D3 of the third transistor T3 and the fourth drain electrode D4 of the fourth transistor T4 through another contact hole.

In an exemplary embodiment, the second connecting pattern 144 is spaced apart from the first connecting pattern 143. The second connecting pattern 144 may be connected to the initialization voltage line 131 through a contact hole, and may be connected to the fourth source electrode S4 of the fourth transistor T4 and the seventh source electrode S7 of the seventh transistor T7 through another contact hole.

In an exemplary embodiment, the third connecting pattern 145 is spaced apart from the second connecting pattern 144. The third connecting pattern 145 may be connected to the sixth drain electrode D6 of the sixth transistor T6 through a contact hole.

A fifth insulation layer IL5 may be disposed on the data line 141, the driving voltage line 142, the first connecting pattern 143, the second connecting pattern 144, and the third connecting pattern 145. The fifth insulation layer IL5 may include an organic insulation material such as polyimide (PI).

The light emitting element EE is disposed on the fifth insulation layer IL5. The light emitting element EE includes a first electrode 151, an emission layer 152, and a second electrode 153. The first electrode 151 may be connected to the third connecting pattern 145 through a contact hole. A sixth insulation layer IL6 may be disposed on a peripheral portion of the first electrode 151. The sixth insulation layer IL6 may include an opening that exposes a center portion of the first electrode 151 to define an emission area. The sixth insulation layer IL6 may include an organic insulation material such as polyimide (PI). In an exemplary embodiment, the sixth insulation IL6 covers left and right edge portions of the first electrode 151.

The emission layer 152 is disposed between the first electrode 151 and the second electrode 153. The second electrode 153 is disposed on the emission layer 152. At least one of the first electrode 151 and the second electrode 153 may be one of a light-transmitting electrode, a light reflective electrode, and a light semi-transmitting electrode, and light generated from the emission layer 152 may be emitted toward at least one of the first electrode 151 and the second electrode 153.

A capping layer covering the light emitting element EE may be disposed on the light emitting element EE. An encapsulation layer or an encapsulation substrate may be disposed on the light emitting element EE with the capping layer in between.

Figure 7:
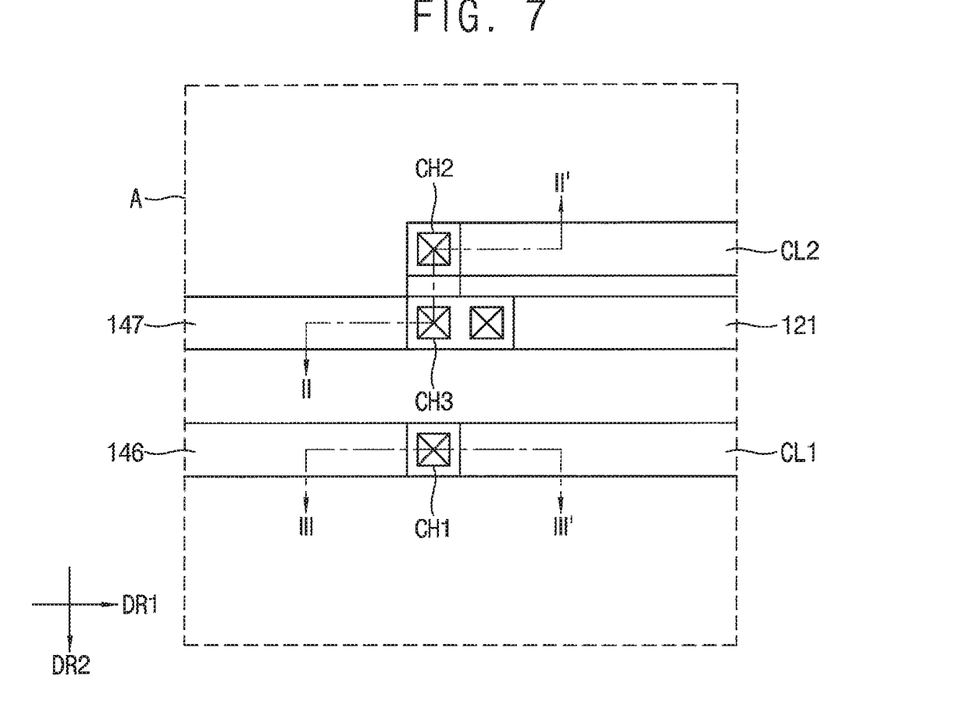
FIG. 7 is a plan view illustrating a non-display area of the display device in FIG. 1.
Figure 8:
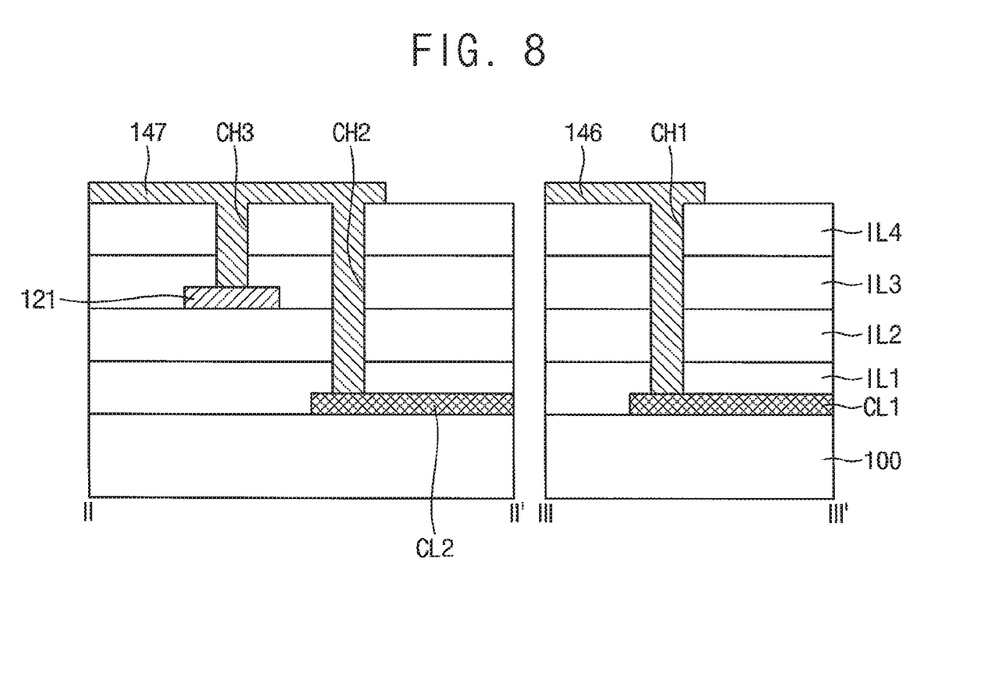
FIG. 8 is a cross-sectional view taken along lines II-II' and III-III' in FIG. 7.

FIG. 7 is a plan view illustrating the non-display area NDA of the display device in FIG. 1 according to an exemplary embodiment of the inventive concept. For example, FIG. 7 illustrates an area A in FIG. 1. FIG. 8 is a cross-sectional view taken along lines II-II' and III-III' in FIG. 7.

Referring to FIGS. 1, 7, and 8, the display device includes the first conductive line CL1, the second conductive line CL2, the first scan line 121, a variable voltage supplying line 146, and a scan signal supplying line 147 which are disposed in the non-display area NDA. The first conductive line CL1, the second conductive line CL2, and the first scan line 121 may extend from the display area DA to the non-display area NDA.

The variable voltage supplying line 146 may extend from the power supply 30 in FIG. 2, and may be connected to the first conductive line CL1. Accordingly, the first conductive line CL1 may be connected to the variable voltage supplying line 146 outside the display area DA. In an exemplary embodiment, the variable voltage supplying line 146 transmits a variable voltage to the first conductive line CL1. The variable voltage supplying line 146 may be disposed on the fourth insulation layer IL4. Accordingly, the variable voltage supplying line 146 may be disposed on the first conductive layer CL1 with an insulation layer, e.g., the first to fourth insulation layers IL1, IL2, IL3, and IL4, in between outside the display area DA. In an exemplary embodiment, the variable voltage supplying line 146 is connected to the first conductive line CL1 through a first contact hole CH1 passing through the first to fourth insulation layers IL1, IL2, IL3, and IL4. For example, the variable voltage supplying line 146 may include a first vertical portion that passes through the first to fourth insulation layers IL1, IL2, IL3, and IL4 to connected to the first conductive line CL1. In an exemplary embodiment, a first width of the vertical portion is substantially uniform.

The scan signal supplying line 147 may extend from the driving circuit unit 20 in FIG. 2, and may be connected to the second conductive line CL2 and the first scan line 121. Accordingly, each of the second conductive line CL2 and the first scan line 121 may be connected to the scan signal supplying line 147 outside the display area DA. The scan signal supplying line 147 may transmit a scan signal to the second conductive line CL2 and the first scan line 121. In an exemplary embodiment, the scan signal includes a gate-on voltage (e.g., a pulse) that when applied to a gate terminal of a transistor of a pixel, the pixel receives data through a data line connected to a source terminal of the transistor. The scan signal supplying line 147 may be disposed on the fourth insulation layer IL4. Accordingly, the scan signal supplying line 147 may be disposed on the second conductive layer CL2 with an insulation layer, e.g., the first to fourth insulation layers IL1, IL2, IL3, and IL4, in between and on the first scan line 121 with an insulation layer, e.g., the third and fourth insulation layers IL3 and IL4, in between outside the display area DA. In an exemplary embodiment, the scan signal supplying line 147 is connected to the second conductive line CL2 through a second contact hole CH2 passing through the first to fourth insulation layers IL1, IL2, IL3, and IL4, and may be connected to the first scan line 121 through a third contact hole CH3 passing through the third and fourth insulation layers IL3 and IL4. For example, the variable voltage supplying line 147 may include a second vertical portion that passes through the first to fourth insulation layers IL1, IL2, IL3, and IL4 to connect to the second conductive line CL2, and a third vertical portion that passes through the third and fourth insulation layers IL3 and IL4 to connect to the first scan line 121. In an exemplary embodiment, a second width of the second vertical portion is substantially uniform. In an exemplary embodiment, a width of the first and second vertical portions is the same. In an exemplary embodiment, a height of the first and second vertical portions is the same.

Figure 9:
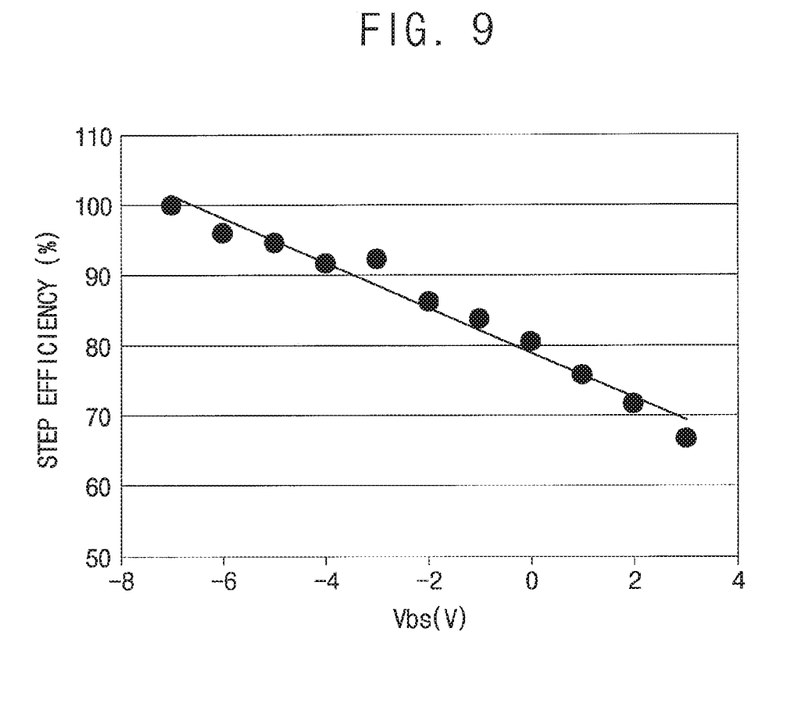
FIG. 9 is a graph illustrating an exemplary step efficiency according to a variable voltage which a first conductive line receives.

FIG. 9 is a graph illustrating exemplary step efficiency according to a variable voltage which the first conductive line CL1 receives. In FIG. 9, a horizontal axis of the graph illustrates a voltage difference between the first bottom gate electrode BG1 and the first source electrode S1 of the first transistor T1, and a vertical axis of the graph illustrates a step efficiency that is a ratio of luminance of light emitted from the light emitting element EE to luminance corresponding to a data voltage DATA.

Referring to FIG. 9, as the magnitude of the variable voltage VV decreases, that is, a difference between the magnitude of the variable voltage VV which the first conductive line CL1 receives and the magnitude of a voltage of the first source electrode S1 of the first transistor T1 decreases, the step efficiency of the display device increases. When the magnitude of the variable voltage decreases, on-current of the first transistor T1 increases, and therefore, the step efficiency of the display device may be improved.

Figure 10:
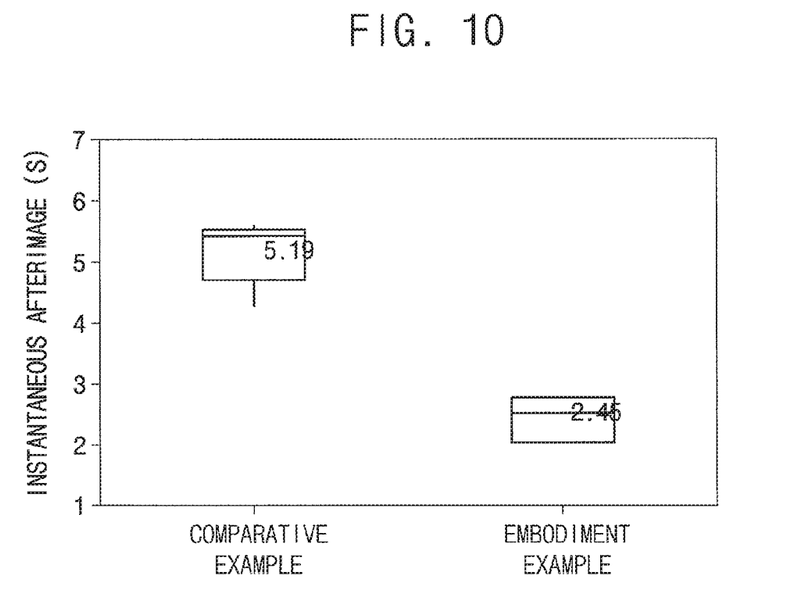
FIG. 10 is a graph illustrating instantaneous afterimage of display devices according to an embodiment example and a comparative example.

FIG. 10 is a graph illustrating exemplary instantaneous afterimages of display devices according to an embodiment example and a comparative example. In the embodiment example, the first bottom gate electrode BG1 of the first transistor T1 receives a variable voltage VV having a positive voltage of about 7.5 V. In the comparative example, the first bottom gate electrode BG1 of the first transistor T1 receives a driving voltage VDD having a voltage of about 4.6 V.

Referring to FIG. 10, when the first bottom gate electrode BG1 of the first transistor T1 receives a variable voltage having a relatively large voltage, e.g., a voltage greater than the driving voltage VDD, the sustainment time of the instantaneous afterimages of the display device decreases. In other words, as the magnitude of the variable voltage which the first bottom gate electrode BG1 of the first transistor T1 receives increases, the sustainment time of the instantaneous afterimage of the display device decreases. When the first bottom gate electrode BG1 receives the variable voltage having a relatively large voltage, hysteresis of the first transistor T1 may be improved, therefore, instantaneous afterimages of the display device due to the hysteresis of the first transistor T1 may be improved.

In an exemplary embodiment, the variable voltage VV is set to be different (e.g., lower or higher) than the driving voltage VDD. In an exemplary embodiment, the variable voltage lower VV is a negative voltage and the driving voltage VDD is a positive voltage. In an exemplary embodiment, the variable voltage VV and the driving voltage VDD are both positive voltages and the variable voltage VV is higher than the driving voltage VDD.

A display device according to at least one embodiment of the inventive concept may be applied included in a computer, a notebook, a mobile phone, a smartphone, a smart pad, a portable media player (PMP), a personal digital assistant (PDA), or an MP3 player.

Although a display device according to exemplary embodiment of the inventive concept have been described with reference to the drawings, the illustrated embodiments are examples, and may be modified and changed one having ordinary skill in the art without departing from the technical spirit described in the present application.

What is claimed is:

1. A display device, comprising:
a first transistor including a first channel region, a first gate electrode overlapping the first channel region, and a first electrode receiving a driving voltage;
a second transistor electrically connected to the first electrode of the first transistor, the second transistor including a second channel region and a second gate electrode overlapping the second channel region and receiving a scan signal;
a light emitting element electrically connected to a second electrode of the first transistor;
a first conductive line overlapping the first gate electrode, where the first channel region is located between the first conductive line and the first gate electrode, the first conductive line receiving a variable voltage different from the driving voltage; and
a second conductive line overlapping the second gate electrode, where the second channel region is located between the second conductive line and the second gate electrode, the second conductive line receiving the scan signal.

2. The display device of claim 1, wherein the variable voltage is a positive voltage greater than the driving voltage or a negative voltage lower than the driving voltage.

3. The display device of claim 1, further comprising:
a third transistor electrically connected to the second electrode of the first transistor, the third transistor including a third channel region and a third gate electrode overlapping the third channel region and receiving the scan signal.

4. The display device of claim 3, wherein the second conductive line overlaps the third gate electrode and the third channel region is located between the second conductive line the third gate electrode.

5. The display device of claim 3, further comprising a scan line receiving the scan signal, wherein each of the second gate electrode and the third gate electrode is a portion of the scan line.

6. The display device of claim 1, wherein the first conductive line includes an extending portion extending along a first direction and an overlapping portion overlapping the first gate electrode.

7. The display device of claim 6, wherein a width of the overlapping portion in a second direction crossing the first direction is greater than a width of the extending portion in the second direction.

8. The display device of claim 1, wherein the second conductive line includes an extending portion extending along a first direction and an overlapping portion overlapping the second gate electrode.

9. The display device of claim 8, wherein the overlapping portion protrudes from the extending portion in a second direction crossing the first direction.

10. The display device of claim 1, wherein the first conductive line is connected to a variable voltage supplying line located outside a display area.

11. The display device of claim 1, wherein the second conductive line is connected to a scan signal supplying line located outside a display area.

12. The display device of claim 1, wherein each of the first transistor and the second transistor is a p-channel metal-oxide semiconductor (PMOS) transistor.

13. A display device, comprising:
a substrate;
a first conductive layer disposed on the substrate and receiving a variable voltage;
a second conductive layer disposed on the substrate, spaced apart from the first conductive layer, and receiving a scan signal;
a first transistor including a first active layer disposed on the first conductive layer and a first gate electrode disposed on the first active layer, a first end of the first active layer receiving a driving voltage different from the variable voltage;
a second transistor including a second active layer disposed on the second conductive layer and electrically connected to the first end of the first active layer and a second gate electrode disposed on the second active layer and receiving the scan signal; and
a light emitting element electrically connected to the first transistor,
wherein the first conductive layer is disposed between the substrate and the first active layer to overlap the first active layer in a first direction and to be spaced apart from the first active layer in a second other direction, and
wherein the second conductive layer is disposed between the substrate and the second active layer to overlap the second active layer in the first direction and to be spaced apart from the second active layer in the second direction.

14. The display device of claim 13, wherein the variable voltage is a positive voltage greater than the driving voltage or a negative voltage lower than the driving voltage.

15. The display device of claim 13, further comprising:
a third transistor including a third active layer disposed on the second conductive layer and electrically connected to a second end of the first active layer and a third gate electrode disposed on the third active layer and receiving the scan signal.

16. The display device of claim 13, wherein the first conductive layer is connected to a variable voltage supplying line located outside a display area.

17. The display device of claim 16, wherein the variable voltage supplying line is disposed on the first conductive layer, wherein an insulation layer is disposed between the variable voltage supplying line and the first conductive layer outside the display area, and wherein the first conductive layer contacts the variable voltage supplying line through a contact hole formed in the insulation layer.

18. The display device of claim 13, wherein the second conductive layer is connected to a scan signal supplying line located outside a display area.

19. The display device of claim 18, wherein the scan signal supplying line is disposed on the second conductive layer, wherein an insulation layer is disposed between the scan signal supplying line and the second conductive layer outside the display area, and wherein the second conductive layer contacts the scan signal supplying line through a contact hole formed in the insulation layer.

20. The display device of claim 13, wherein each of the first transistor and the second transistor is a p-channel metal-oxide semiconductor (PMOS) transistor.

21. A display device comprising:
a light emitting element;
a driving transistor for controlling a current passing through the light emitting element, the driving transistor including a first terminal connected to a node receiving a driving voltage, a top gate terminal disposed between a substrate and the light emitting element, a bottom gate terminal connected to a node receiving a variable voltage and disposed between the substrate and the top gate terminal;
a single active layer disposed to overlap the bottom gate terminal and a bottom gate terminal of another transistor in a plan view; and
a driving circuit configured to provide the variable voltage, wherein the variable voltage is a positive voltage greater than driving voltage or a negative voltage less than the driving voltage.

22. The display device of claim 21, wherein the driving circuit is configured to change a value of the variable voltage to the negative voltage to increase a step efficiency of the display device or to the positive voltage to reduce a number of afterimages perceivable on the display device.

* * * * *